United States Patent
Takao et al.

(10) Patent No.: US 9,711,498 B2
(45) Date of Patent: Jul. 18, 2017

(54) SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventors: Kazuto Takao, Tsukuba (JP); Ryosuke Iijima, Setagaya (JP); Tatsuo Shimizu, Shinagawa (JP); Teruyuki Ohashi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/062,388

(22) Filed: Mar. 7, 2016

(65) Prior Publication Data

US 2016/0284682 A1    Sep. 29, 2016

(30) Foreign Application Priority Data

Mar. 24, 2015  (JP) .................................. 2015-060252
Dec. 7, 2015  (JP) .................................. 2015-238931

(51) Int. Cl.
*H01L 27/02* (2006.01)
*H01L 29/16* (2006.01)
(Continued)

(52) U.S. Cl.
CPC ...... *H01L 27/0251* (2013.01); *H01L 27/0292* (2013.01); *H01L 27/0629* (2013.01);
(Continued)

(58) Field of Classification Search
CPC . H01L 27/0251; H01L 29/1608; H02M 7/533
See application file for complete search history.

(56) References Cited

U.S. PATENT DOCUMENTS 6,028,779 A   2/2000 Sakamoto et al.
6,943,445 B2  9/2005 Shirakawa et al.
(Continued)

FOREIGN PATENT DOCUMENTS

JP   11-155286    6/1999
JP   2005-5593    1/2005
(Continued)

OTHER PUBLICATIONS

U. Scheuermann "Power Module Design without Solder Interfaces—An Ideal Solution for Hybrid Vehicle Traction Applications", Applied Power Electronics Conference and Exposition, Twenty-Fourth Annual IEEE 2009, 2009, 7 pages.

*Primary Examiner* — Mark Prenty
(74) *Attorney, Agent, or Firm* — Oblon, McClelland, Maier & Neustadt, L.L.P.

(57) ABSTRACT

A semiconductor device according to an embodiment includes a plurality of circuit units each including a substrate, a first electrode on a first side of the substrate, a second electrode aligned with the first electrode on the first side of the substrate, a third electrode on a second side of the substrate, and a first switching element and a second switching element. The switching elements are aligned on the substrate between the first electrode, second electrode and third electrode, electrically connected in series between the first electrode and the second electrode, and having the third electrode electrically connected therebetween. In two of the adjacent circuit units, the first side of one circuit unit and the first side of the other circuit unit are adjacent to each other, and the second side of the one and the second side of the other are adjacent to each other.

18 Claims, 16 Drawing Sheets

(51) Int. Cl.
- *H01L 29/78* (2006.01)
- *H01L 27/06* (2006.01)
- *H02M 7/00* (2006.01)

(52) U.S. Cl.
CPC ...... *H01L 27/0658* (2013.01); *H01L 29/1608* (2013.01); *H01L 29/7805* (2013.01); *H01L 29/7813* (2013.01); *H02M 7/003* (2013.01)

(56) References Cited

U.S. PATENT DOCUMENTS

| | | |
|---|---|---|
| 9,214,459 B2 * | 12/2015 | Takao .................. H01L 23/642 |
| 2013/0105960 A1 | 5/2013 | Jones et al. |
| 2014/0084993 A1 | 3/2014 | Takao et al. |
| 2014/0375153 A1 | 12/2014 | Suzuki |
| 2015/0155276 A1 | 6/2015 | Takao et al. |
| 2016/0284683 A1 | 9/2016 | Takao et al. |

FOREIGN PATENT DOCUMENTS

| | | |
|---|---|---|
| JP | 2007-12721 | 1/2007 |
| JP | 2007-234690 | 9/2007 |
| JP | 2014-67760 | 4/2014 |
| JP | 2014-93421 | 5/2014 |
| JP | 2015-6116 | 1/2015 |
| JP | 2015-19110 | 1/2015 |
| JP | 2015-106646 | 6/2015 |
| JP | 2016-181675 A | 10/2016 |

\* cited by examiner

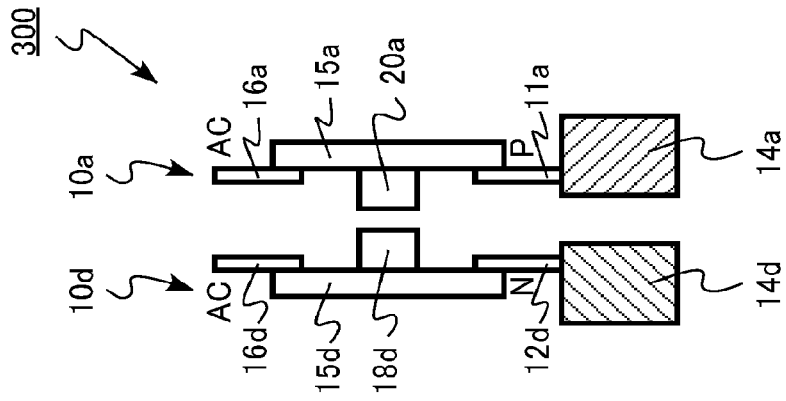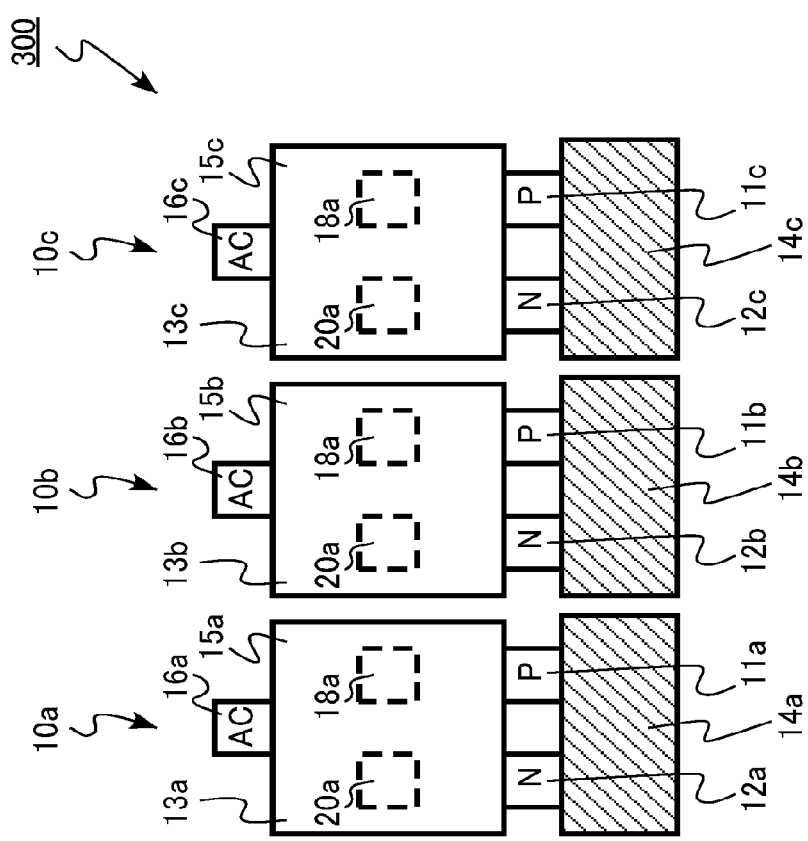

SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2015-060252, filed on Mar. 24, 2015, and Japanese Patent Application No. 2015-238931, filed on Dec. 7, 2015, the entire contents of which are incorporated herein by reference.

FIELD

Embodiments described herein relate generally to a semiconductor device, an inverter circuit, a driving device, a vehicle, and an elevator.

BACKGROUND

For example, in a power semiconductor module such as a power conversion module, there may be a problem that the faster switching operation is, the more likely breakdown of a semiconductor device and noise generation may be caused by overvoltage during turn-off time. The overvoltage during the turn-off time is proportional to a time change rate between inductance and current flowing in the power semiconductor module (di/dt).

When a switching time is taken long in order to suppress overvoltage, switching operation becomes slow. Simultaneously, a switching loss represented by time integration of a product of current and voltage is increased. In order to suppress overvoltage and further reduce the switching loss, it is desirable to reduce inductance of the power semiconductor module. There is a method to divide the power semiconductor module into a plurality of circuit units in order to reduce inductance.

BRIEF DESCRIPTION OF THE DRAWINGS

FIGS. 10A and 10B are schematic diagrams illustrating a semiconductor device according to a third embodiment;

DETAILED DESCRIPTION

Figure 1:
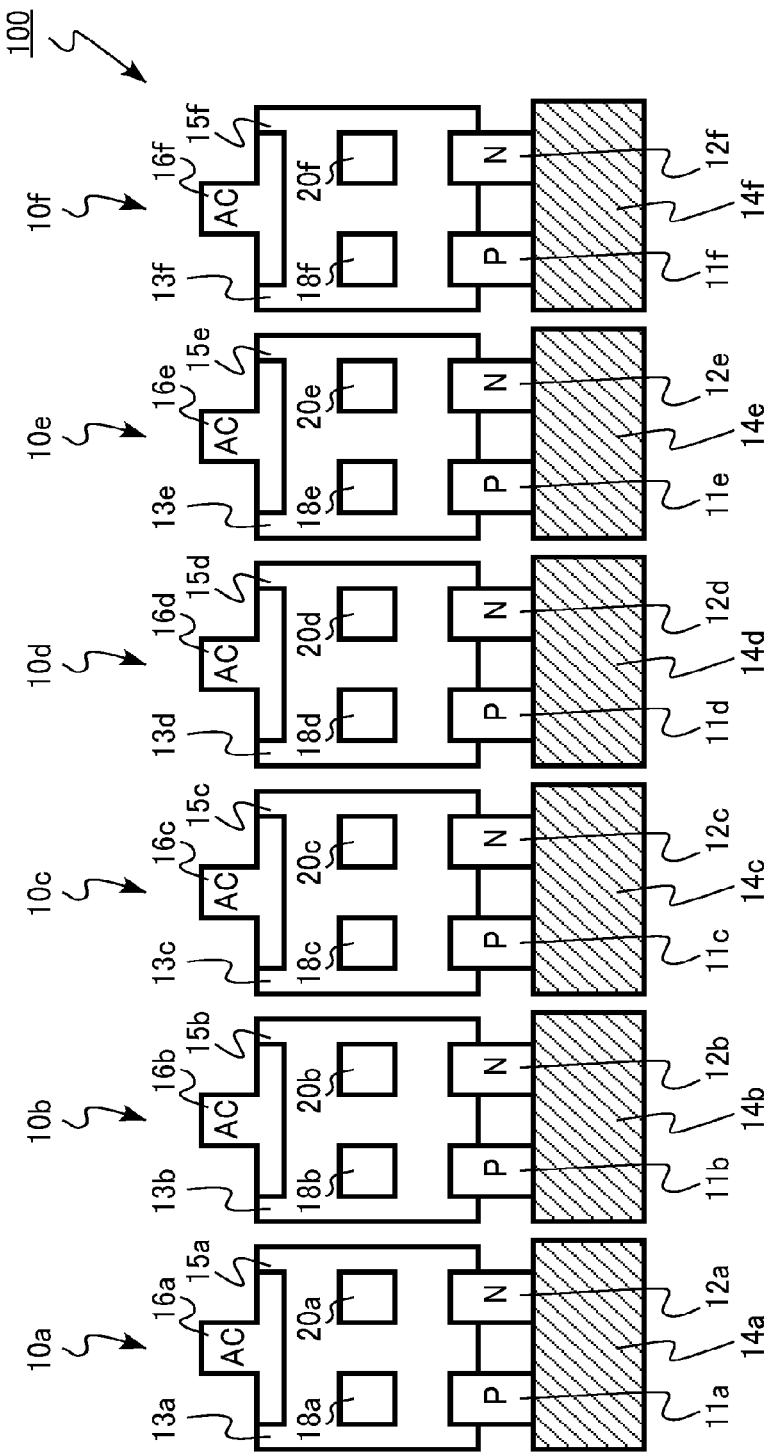
FIG. 1 is a schematic plan view illustrating a semiconductor device according to a first embodiment.

A semiconductor device according to an embodiment includes a plurality of circuit units, and each of the circuit units includes a substrate, a first electrode provided on a first side of the substrate, a second electrode aligned with the first electrode on the first side of the substrate, a third electrode provided on a second side of the substrate, and a first switching element and a second switching element neighboring the first switching element, the first switching element and the second switching element being aligned on the substrate between the first electrode, the second electrode, and the third electrode, the first switching element and the second switching element being electrically connected in series between the first electrode and the second electrode, and the third electrode being electrically connected between the first switching element and the second switching element.

Embodiments of the present disclosure will be described below with reference to the drawings. In the following description, note that a same component or the like will be denoted by a same reference sign and a description for a component or the like once described will be suitably omitted.

First Embodiment

A semiconductor device according to the present embodiment includes a plurality of circuit units, and each of the circuit units includes a substrate, a first electrode on a first side of the substrate, a second electrode aligned with the first electrode on the first side of the substrate, a third electrode on a second side of the substrate, and a first switching element and a second switching element neighboring the first switching element. The first switching element and the second switching element are aligned on the substrate between the first electrode, the second electrode, and the third electrode, electrically connected in series between the first electrode and the second electrode, and have the third electrode electrically connected therebetween. Further, in two of the adjacent circuit units, the first side of one circuit unit and the first side of the other circuit unit are adjacent to each other and the second side of the one and the second side of the other are adjacent to each other.

Further, a semiconductor device according to the present embodiment includes a first circuit unit and a second circuit unit, and each of the first circuit unit and the second circuit unit includes, a substrate, a first electrode on a first side of the substrate, a second electrode aligned with the first electrode on the first side of the substrate, a third electrode on a second side of the substrate, and a first switching element and a second switching element. The first switching element and the second switching element are aligned on the substrate between the first electrode, the second electrode and the third electrode, electrically connected in series between the first electrode and the second electrode, and have the third electrode electrically connected therebetween. Further, the first side of the first circuit unit and the first side of the second circuit unit are adjacent to each other and the second side of the first circuit unit and the second side of the second circuit unit are adjacent to each other.

FIG. 1 is a schematic plan view illustrating the semiconductor device according to the present embodiment. The semiconductor device according to the present embodiment is a semiconductor module used in an inverter circuit.

A semiconductor module 100 includes a plurality of circuit units 10a to 10f. Further, the circuit units 10a to 10f respectively include first electrodes 11a to 11f, second electrodes 12a to 12f, switching element portions 13a to 13f, capacitor portions 14a to 14f, and AC electrodes (third electrodes) 16a to 16f. Further, the circuit units 10a to 10f respectively include gate signal terminals not illustrated.

The switching element portions 13a to 13f respectively include insulating or conductive substrates 15a to 15f. The first electrodes 11a to 11f and the second electrodes 12a to 12f are respectively provided on first end portions (first sides) of the substrates 15a to 15f in a manner aligned with each other. The AC electrodes 16a to 16f are respectively provided on second end portions (second sides) located on opposite sides of the first end portions of the substrates 15a to 15f.

The switching element portions 13a to 13f respectively include first switching elements 18a to 18f and second switching elements 20a to 20f. The first switching elements 18a to 18f and the second switching elements 20a to 20f are respectively provided in a manner aligned with each other on the substrates 15a to 15f between the first electrodes 11a to 11f, second electrodes 12a to 12f, and AC electrodes 16a to 16f.

The capacitor portions 14a to 14f are provided respectively interposing the first electrodes 11a to 11f and the second electrodes 12a to 12f on the way to the switching element portions 13a to 13f. In the respective circuit units 10a to 10f, the switching element portions 13a to 13f and the capacitor portions 14a to 14f are provided respectively interposing the first electrodes 11a to 11f and the second electrodes 12a to 12f therebetween.

The plurality of circuit units 10a to 10f is horizontally arranged adjacent to each other.

In two of the adjacent circuit units, the first end portion (first side) of one circuit unit and the first end portion (first side) of the other circuit unit are adjacent to each other, and the second end portion (second side) of the one and the second end portion (second side) of the other are adjacent to each other. Therefore, in two of the adjacent circuit units, the switching element portion of one circuit unit and the switching element portion of the other circuit unit are adjacent to each other, and the capacitor portion of the one and the capacitor portion of the other are adjacent to each other. For example, attention is focused on the circuit unit 10a and the circuit unit 10b adjacent to each other. The switching element portion 13a of the circuit unit 10a and the switching element portion 13b of the circuit unit 10b are adjacent to each other. Further, the capacitor portion 14a of the circuit unit 10a and the capacitor portion 14b of the circuit unit 10b are adjacent to each other.

Further, in two of the adjacent circuit units, the first electrode of one circuit unit and the second electrode of the other circuit unit are adjacent to each other. For example, attention is focused on the circuit unit 10a and the circuit unit 10b adjacent to each other. The first electrode 11b of the circuit unit 10b and the second electrode 12a of the circuit unit 10a are adjacent to each other. The situation is similar in other two of the adjacent circuit units.

The first electrodes 11a to 11f are applied with common potential. The second electrodes 12a to 12f are applied with common potential. The circuit units 10a to 10f are connected in parallel.

The second electrodes 12a to 12f are applied with potential lower than potential applied to the first electrodes 11a to 11f. The first electrodes 11a to 11f are applied with positive potential. The second electrodes 12a to 12f are grounded or applied with negative potential.

Figure 2:
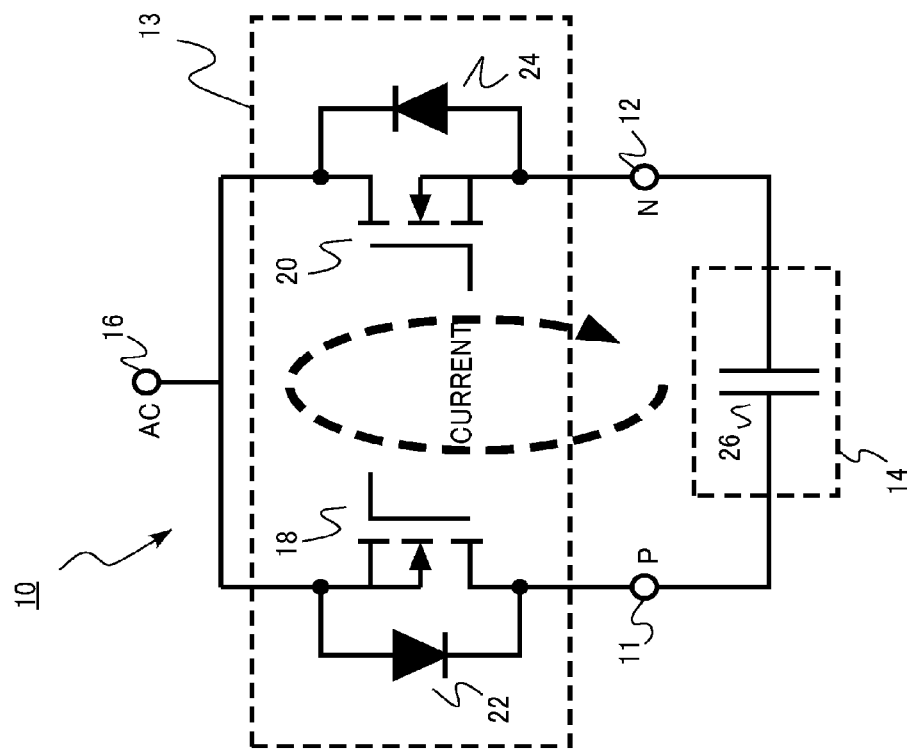
FIG. 2 is a diagram illustrating an equivalent circuit of a circuit unit according to the first embodiment.

FIG. 2 is a diagram illustrating an equivalent circuit of the circuit unit according to the present embodiment. The circuit diagram corresponds to the circuit of each of the circuit units 10a to 10f.

A circuit unit 10 includes a first electrode 11, a second electrode 12, a switching element portion 13, a capacitor portion 14, and an AC electrode 16.

The switching element portion 13 includes a first switching element 18, a second switching element 20, a first diode 22, and a second diode 24. The first switching element 18, second switching element 20, first diode 22, and second diode 24 are mounted on, for example, an insulating or conductive substrate not illustrated.

The first switching element 18 and the second switching element 20 are electrically connected in series between the first electrode 11 and the second electrode 12. The first switching element 18 and the second switching element 20 are, for example, metal oxide semiconductor field effect transistors (MOSFET) of silicon carbide (SiC).

The first diode 22 is connected in parallel to the first switching element 18. The second diode 24 is connected in parallel to the second switching element 20. The first diode 22 and the second diode 24 are flywheel diodes.

The capacitor portion 14 includes a capacitor 26. The capacitor 26 is electrically connected in parallel to the first switching element 18 and the second switching element 20 between the first electrode 11 and the second electrode 12.

The second electrode 12 is applied with potential lower than potential applied to the first electrode 11. The first electrode 11 is applied with positive potential. The second electrode 12 is grounded or applied with negative potential.

The AC electrode 16 is connected between the first switching element 18 and the second switching element 20. AC voltage is output from the AC electrode 16 by controlling gate voltage at the first switching element 18 and the second switching element 20.

In a state that the circuit unit 10 is operated, current flows in a direction indicated by a dotted arrow in FIG. 2.

Next, function and effects of the semiconductor device according to the present embodiment will be described.

Figure 3A:
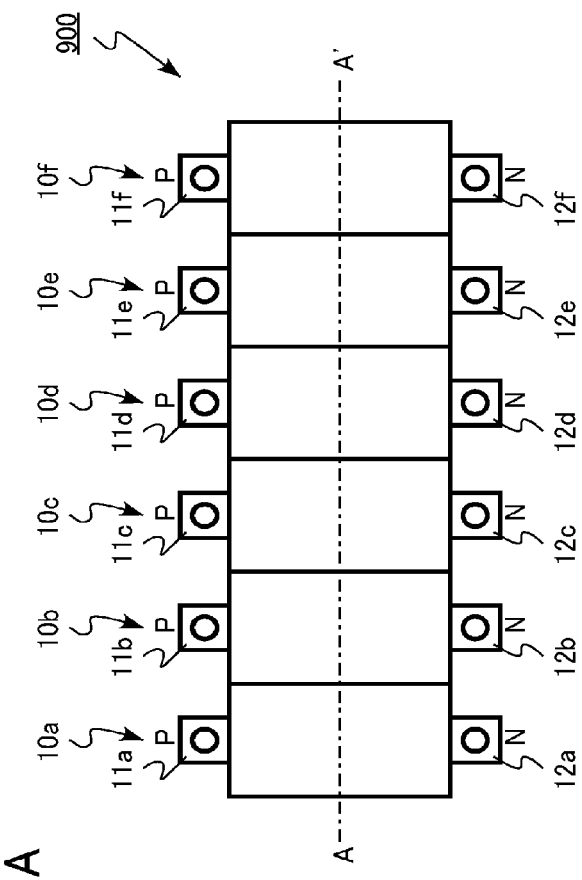
FIGS. 3A and 3B are schematic diagrams illustrating a semiconductor device according to a comparative embodiment.
Figure 3B:
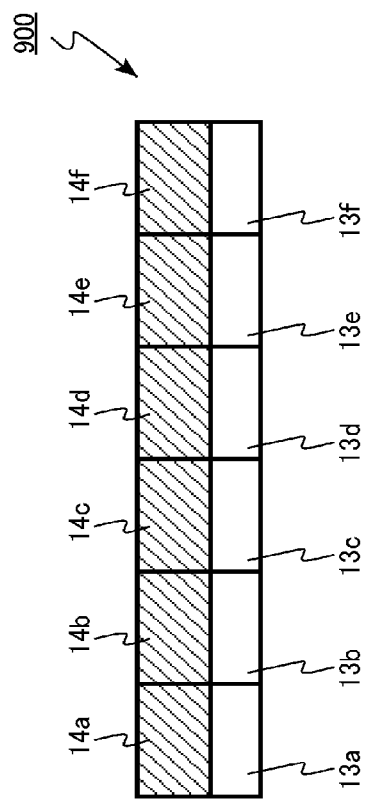

FIGS. 3A and 3B are schematic diagrams illustrating a semiconductor device according to a comparative embodiment. FIG. 3A is a plan view, and FIG. 3B is a cross-sectional view taken along a line A-A' in FIG. 3A. The semiconductor device according to the comparative embodiment is a semiconductor module used in an inverter circuit.

A semiconductor module 900 differs from the semiconductor module 100 of the present embodiment in having a stacked structure in which switching element portions 13a to 13f and capacitor portions 14a to 14f are stacked respectively. Further, the semiconductor module 900 differs from the semiconductor module 100 of the present embodiment in that the switching element portions 13a to 13f and the capacitor portions 14a to 14f are respectively provided between the first electrodes 11a to 11f and the second electrodes 12a to 12f.

Figure 4:
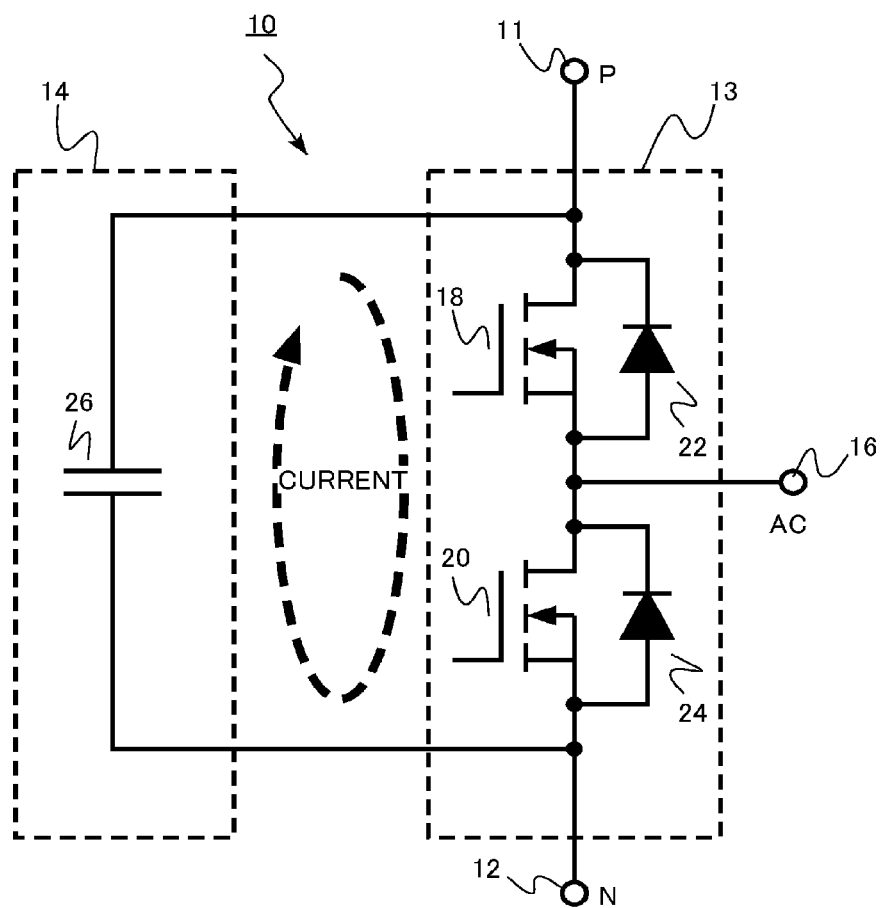
FIG. 4 is a diagram illustrating an equivalent circuit of a circuit unit according to the comparative embodiment.

FIG. 4 is a diagram illustrating an equivalent circuit of the circuit unit according to the comparative embodiment. The circuit diagram corresponds to the circuit of each of the circuit units 10a to 10f. The circuit itself is equivalent to the circuit illustrated in FIG. 2 although positions of respective constituent elements are illustrated different from FIG. 2 in order to compare the positions of respective constituent elements in each of the circuit units illustrated in FIGS. 3A and 3B.

The semiconductor module 900 is divided into the plurality of circuit units 10a to 10f, thereby reducing inductance. When mutual inductance between the circuit units 10a to 10f is disregarded, inductance of the semiconductor module 900 is reduced to 1/N by dividing the semiconductor module 900 into N circuit units. According to the comparative embodiment, the number of circuit units is six. Therefore, inductance is reduced to 1/6.

Therefore, overvoltage proportional to a time change rate between inductance and current flowing in the power semiconductor module (di/dt) is suppressed during turn-off time. As a result, breakdown of a semiconductor device and noise generation can be suppressed.

Figure 5:
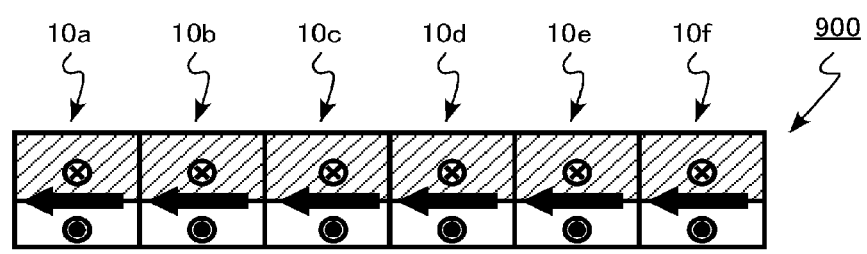
FIG. 5 is a diagram illustrating current directions and magnetic flux directions at the time of operating the semiconductor device according to the comparative embodiment.

FIG. 5 is a diagram illustrating current directions and magnetic flux directions at the time of operating the semiconductor device according to the comparative embodiment. In the diagram, black arrows indicate the magnetic flux directions. Further, the current directions are indicated by marks.

As illustrated in FIG. 5, in the semiconductor module 900 according to the comparative embodiment, the current direction in the switching element portion in each of the circuit units 10a to 10f is from a back side to a front side of the drawing paper. Further, the current direction in the capacitor portions is from the front side to the back side of the drawing paper.

The magnetic flux directions in the circuit units 10a to 10f are same, and the respective magnetic fluxes are mutually strengthened by overlapping. Therefore, mutual inductance is added to the inductance, and inductance of the semiconductor module 900 is increased.

Figure 6:
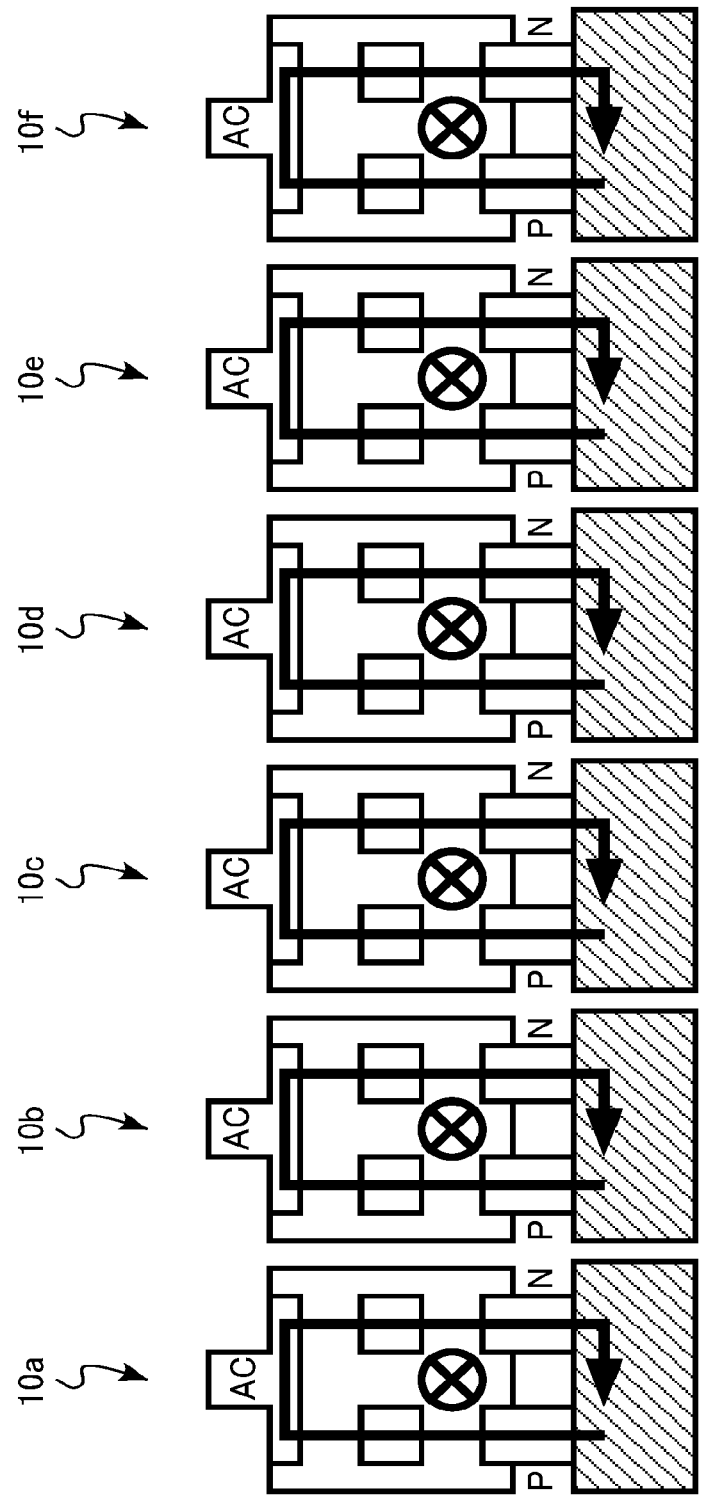
FIG. 6 is a diagram illustrating current directions and magnetic flux directions at the time of operating the semiconductor device according to the first embodiment.

FIG. 6 is a diagram illustrating current directions and magnetic flux directions at the time of operating the semiconductor device according to the present embodiment. In the diagram, black arrows indicate the magnetic flux directions. Further, the current directions are indicated by marks.

In the semiconductor module 100 also, inductance is reduced by dividing the semiconductor module 100 into the plurality of circuit units 10a to 10f.

As illustrated in FIG. 6, current in each of the circuit units 10a to 10f flows clockwise within a surface parallel to the substrate in the semiconductor module 100 according to the present embodiment. The direction of current flowing between the first electrodes 11a to 11f and the AC electrodes 16a to 16f respectively is opposite to the direction of current flowing between the AC electrodes 16a to 16f and the second electrodes 12a to 12f respectively.

Further, the magnetic flux directions of the circuit units 10a to 10f are vertical to the substrate, and the magnetic flux direction is from the front side to the back side of the drawing paper. The magnetic flux directions of the circuit units 10a to 10f are same, but overlapping between the magnetic fluxes is more reduced compared to the comparative embodiment. In other words, interlinked magnetic flux is reduced between closed circuits, compared to the comparative embodiment. Therefore, influence of the magnetic fluxes is reduced between the circuit units, and an added amount of mutual inductance is more reduced compared to the comparative embodiment. Therefore, increase of inductance caused by interference between the circuit units 10a to 10f is reduced.

According to the present embodiment, provided is the semiconductor module in which inductance is more reduced compared to the comparative embodiment and breakdown of a semiconductor device and noise generation can be suppressed.

Note that the number of the circuit units is not limited to six although the example of having the six circuit units has been described. As far as the number of the circuit units is two or more, the number of the circuit units can be optional.

Second Embodiment

A semiconductor device according to the present embodiment is similar to the first embodiment except for that a first electrode of one circuit unit and a first electrode of the other circuit unit are adjacent to each other, or a second electrode of the one and a second electrode of the other are adjacent to each other in two of adjacent circuit units. Therefore, a description for the matters overlapping with the first embodiment will be omitted.

Figure 7:
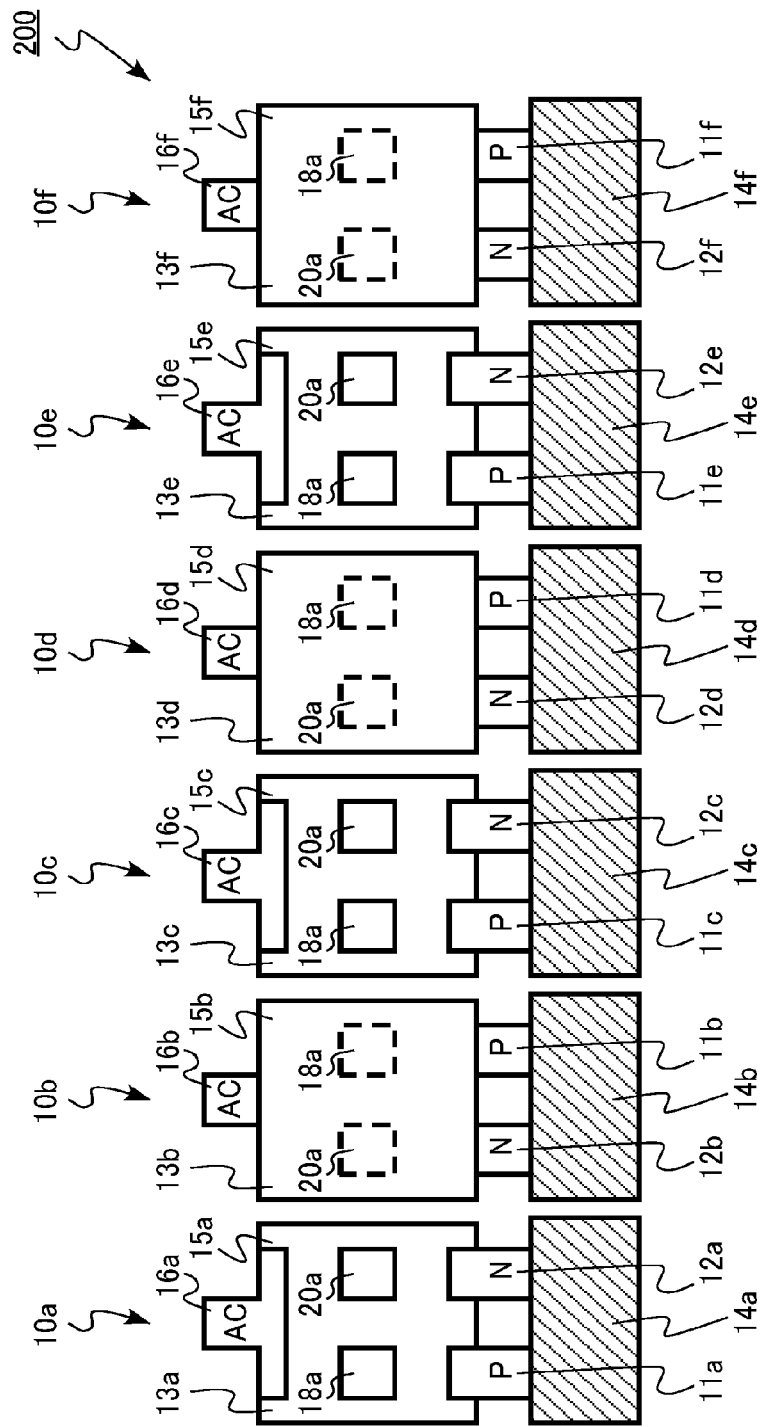
FIG. 7 is a schematic plan view illustrating a semiconductor device according to a second embodiment.

FIG. 7 is a schematic plan view illustrating the semiconductor device according to the present embodiment. The semiconductor device according to the present embodiment is a semiconductor module used in an inverter circuit.

In two of the adjacent circuit units, the first electrode of one circuit unit and the first electrode of the other circuit unit are adjacent to each other, or the second electrode of the one and the second electrode of the other are adjacent to each other. For example, attention is focused on the circuit unit 10a and the circuit unit 10b adjacent to each other. A second electrode 12a of the circuit unit 10a and a second electrode 12b of the circuit unit 10b are adjacent to each other. Further, for example, attention is focused on the circuit unit 10b and a circuit unit 10c adjacent to each other. The first electrode 11b of the circuit unit 10b and a first electrode 11c of the circuit unit 10c are adjacent to each other. The situation is similar in other two of the adjacent circuit units.

For example, the adjacent circuit units 10a to 10f are arranged with a front side and a back side of the substrate of each thereof alternately reversed, thereby achieving an arrangement in that, in two of the adjacent circuits, the first electrode (e.g., 11a to 11f) of one circuit unit and the first electrode (e.g., 11a to 11f) of the other circuit unit are adjacent to each other or the second electrode (e.g., 12a to 12f) of the one and the second electrode (e.g., 12a to 12f) of the other are adjacent to each other.

Figure 8:
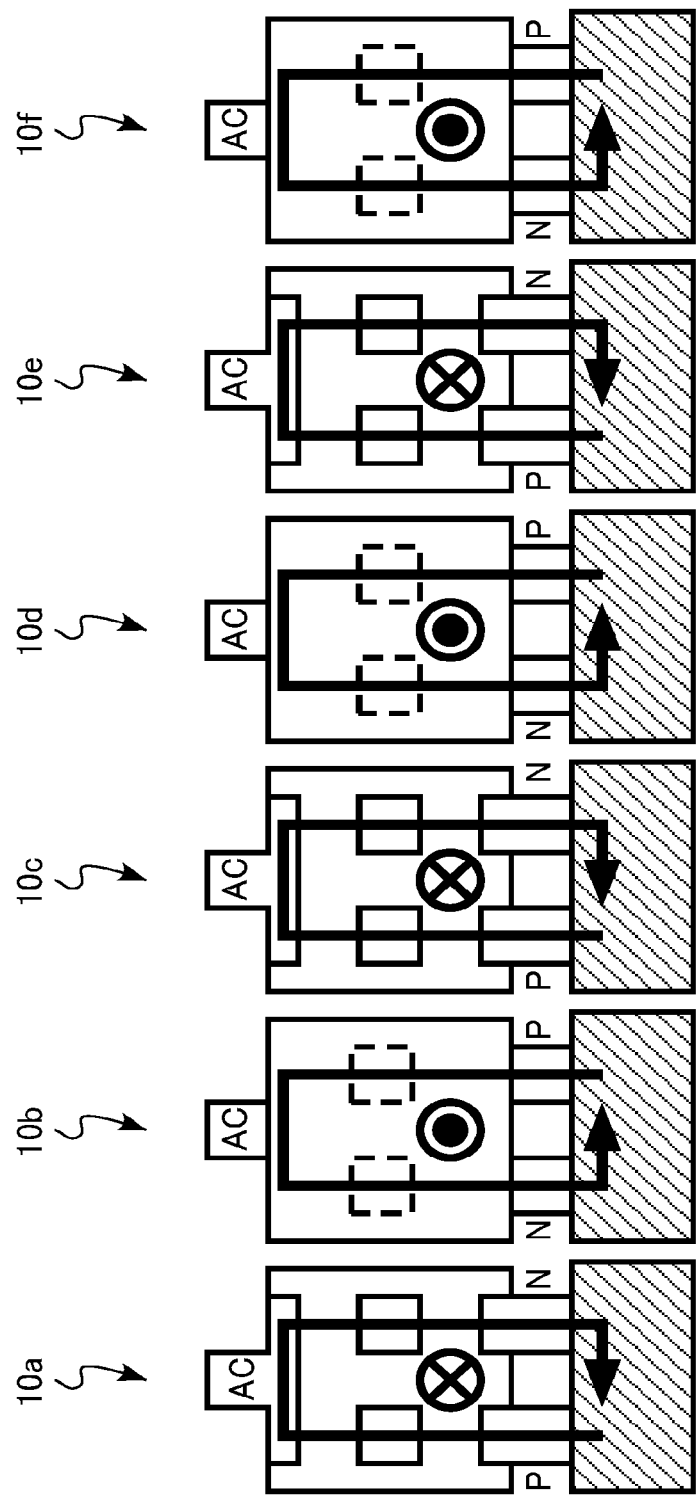
FIG. 8 is a diagram illustrating current directions and magnetic flux directions at the time of operating the semiconductor device according to the second embodiment.

FIG. 8 is a diagram illustrating current directions and magnetic flux directions at the time of operating the semiconductor device according to the present embodiment. In the diagram, black arrows indicate the magnetic flux directions. Further, the current directions are indicated by marks.

As illustrated in FIG. 8, in a semiconductor module 200 according to the present embodiment, current in each of the circuit units 10a, 10c, 10e flows clockwise within a surface parallel to the substrate. On the other hand, current in each of the circuit units 10b, 10d, 10f flows anti-clockwise within the surface parallel to the substrate.

Therefore, the magnetic flux directions in the circuit units 10a, 10c, 10e are vertical to the substrate, and the magnetic flux direction is from a front side to a back side of the drawing paper. On the other hand, the magnetic flux directions of the circuit units 10b, 10d, 10f are vertical to the substrate, and the magnetic flux direction is from the back side to the front side of the drawing paper.

Due to this, magnetic fluxes are cancelled each other between the adjacent circuit units. Therefore, mutual inductance is subtracted from inductance, and the inductance is reduced. As a result, inductance is more reduced than the first embodiment.

According to the present embodiment, provided is the semiconductor module in which inductance is more reduced than the first embodiment, and breakdown of a semiconductor device and noise generation can be suppressed.

Modified Example

Figure 9:
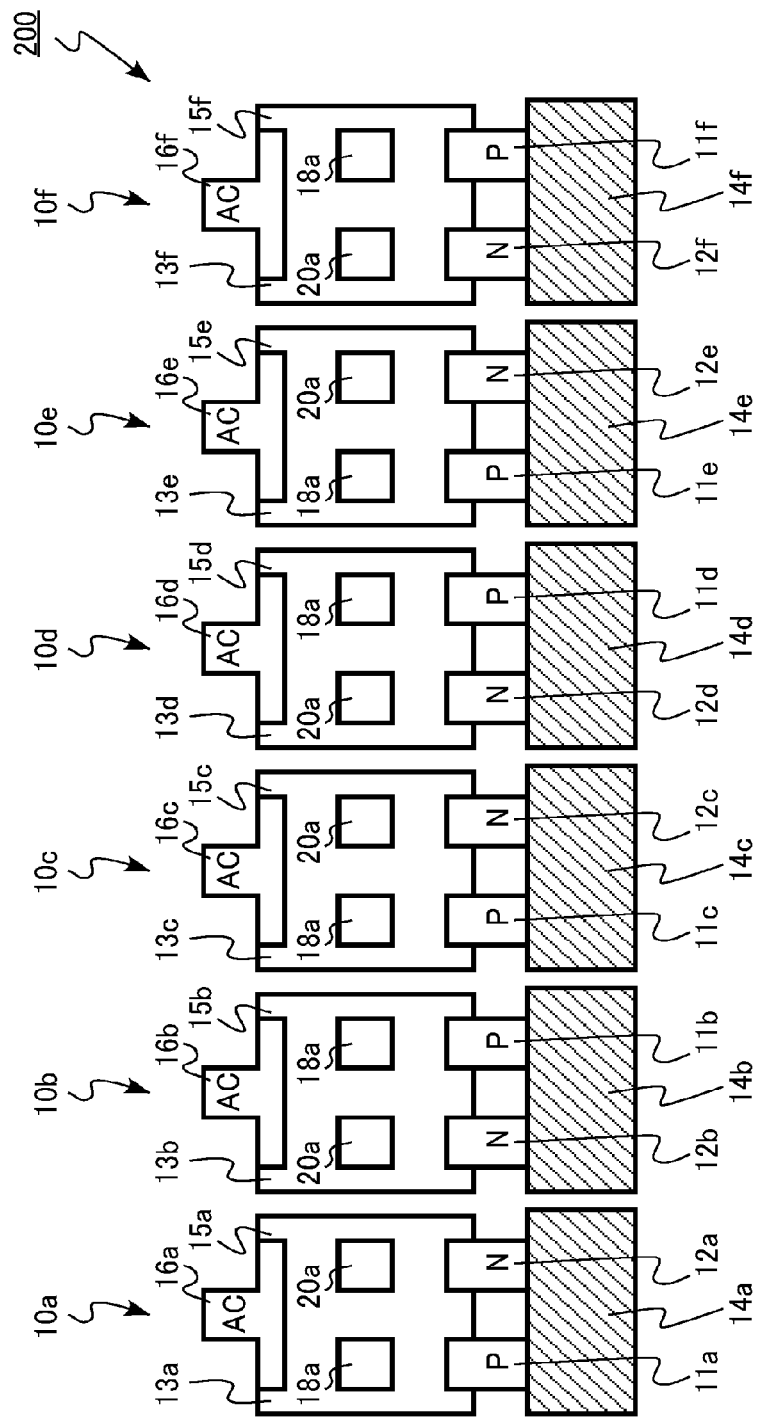
FIG. 9 is a schematic plan view illustrating a semiconductor device according to a modified example of the second embodiment.

FIG. 9 is a schematic plan view illustrating a modified example of the semiconductor device according to present embodiment. The semiconductor device in the present modified example is a semiconductor module used in an inverter circuit. According to the semiconductor device in the present modified example, positions of the electrodes and the switching elements are horizontally reversed in two of the adjacent circuit units. According to this modified example also, the magnetic flux directions of the respective circuit units are similar to the second embodiment. Therefore, similar to the second embodiment, provided is the semiconductor module in which inductance is more reduced than the first embodiment, and breakdown of a semiconductor device and noise generation can be suppressed.

Third Embodiment

A semiconductor device according to the present embodiment includes a plurality of first circuit units arranged in an aligned manner, and each of the first circuit units includes a first substrate, a first electrode on a first side of the first substrate, a second electrode aligned with the first electrode on the first side of the first substrate, a third electrode on a second side of the first substrate, and a first switching element and a second switching element. The first switching element and the second switching element are aligned on the substrate between the first electrode, the second electrode, and the third electrode, electrically connected in series between the first electrode and the second electrode, and have the third electrode electrically connected therebetween. Further, provided is a plurality of second circuit units arranged in an aligned manner, and each of the second circuit units includes a second substrate, a first electrode provided on a first side of the second substrate, a second electrode provided in a manner aligned with the first electrode on the first side of the second substrate, a third electrode provided on a second side of the second substrate, and a first switching element and a second switching element. The first switching element and the second switching element are provided in a manner aligned on the substrate between the first electrode, the second electrode, and the third electrode, electrically connected in series between the first electrode and the second electrode, and have third electrode electrically connected therebetween. Further, in each of the first circuit units and the second circuit units, the first substrate and the second substrate face each other, and the first electrode of one of these circuit units and the second electrode of the other one of these circuit units face each other. In two of the adjacent first circuit units, the first side of one circuit unit and the first side of the other circuit unit are adjacent to each other, the second side of the one and the second side of the other are adjacent to each other. In two of the adjacent second circuit units, the first side of one circuit unit and the first side of the other circuit unit are adjacent to each other and the second side of the one and the second side of the other are adjacent to each other.

Further, a semiconductor device according to the present embodiment includes a first circuit unit and a second circuit unit, and each of the first circuit unit and the second circuit unit includes a substrate, a first electrode on a first side of the substrate, a second electrode aligned with the first electrode on the first side of the substrate, a third electrode on a second side of the substrate, and a first switching element and a second switching element. The first switching element and the second switching element are aligned on the substrate between the first electrode, the second electrode, and the third electrode, electrically connected in series between the first electrode and the second electrode, and have the third electrode electrically connected therebetween. In the first circuit unit and the second circuit unit, the substrate of one of these circuit units and the substrate of the other one of these circuit units face each other, and the first electrode of the one and the second electrode of the other face each other.

The semiconductor device according to the present embodiment differs from a first embodiment in having a structure in which the circuit units are arranged facing each other. A description for the matters overlapping with the first embodiment will be omitted.

Figure 11:
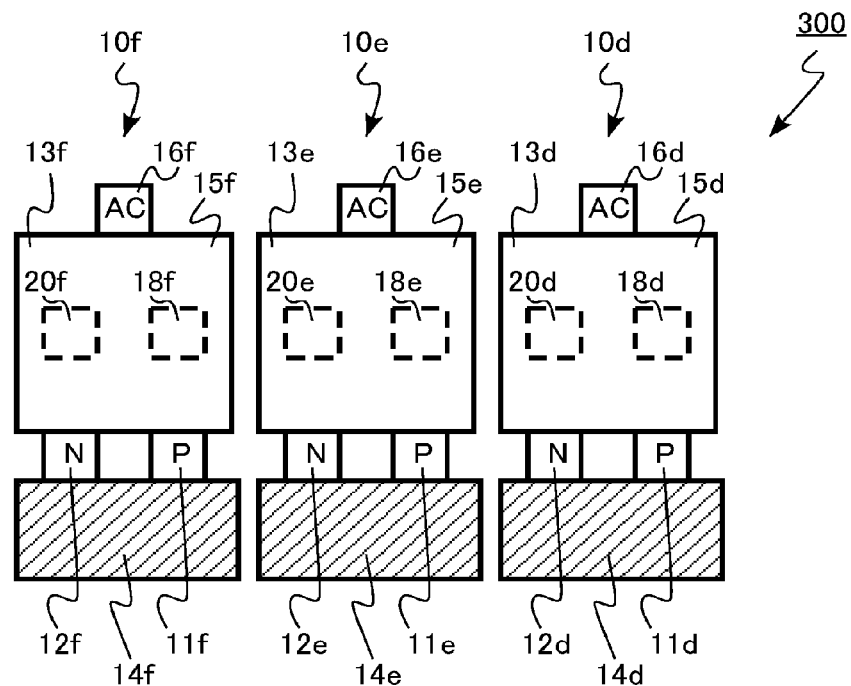
FIG. 11 is a schematic plan view illustrating a semiconductor device according to the third embodiment.

FIGS. 10A and 10B are schematic diagrams illustrating the semiconductor device according to the present embodiment. FIG. 10A is the schematic plan view, and FIG. 10B is the schematic side view. FIG. 11 is a schematic plan view illustrating the semiconductor device according to the present embodiment. FIG. 11 is the plan view when the semiconductor device is viewed from an opposite side of FIG. 10A. The semiconductor device according to the present embodiment is a semiconductor module used in an inverter circuit.

A semiconductor module 300 according to the present embodiment includes first circuit units 10a, 10b, 10c and second circuit units 10d, 10e, 10f. Each of the circuit units has a structure similar to the first embodiment.

The first circuit units 10a, 10b, 10c and the second circuit units 10d, 10e, 10f are arranged in a manner facing each other such that the first electrodes and second electrodes thereof face each other. For example, attention is focused on the first circuit unit 10a and the second circuit unit 10d adjacent to each other. As illustrated in FIG. 10B, a first electrode 11a of the first circuit unit 10a and a second electrode 12d of the second circuit unit 10d face each other.

Further, the substrates (first substrates) 15a, 15b, 15c of the first circuit units 10a, 10b, 10c and the substrates (second substrates) 15d, 15e, 15f of the second circuit units 10d, 10e, 10f are provided in a manner facing each other respectively. For example, as illustrated in FIG. 10B, the substrate (first substrate) 15a and the substrate (second substrate) 15d face each other.

As illustrate in FIGS. 10A and 11, in two of adjacent circuit units, a first end portion (first side) of one circuit unit and a first end portion (first side) of the other circuit unit are adjacent to each other, and a second end portion (second side) of the one and a second end portion (second side) of the other are adjacent to each other. Therefore, in two of the adjacent circuit units, a switching element portion of one circuit unit and a switching element portion of the other circuit unit are adjacent to each other, and a capacitor portion of the one and a capacitor portion of the other are adjacent to each other.

Further, as illustrated in FIGS. 10A and 11, in two of the adjacent circuit units, the first electrode of one circuit unit and the second electrode of the other circuit unit are adjacent to each other.

Figure 12:
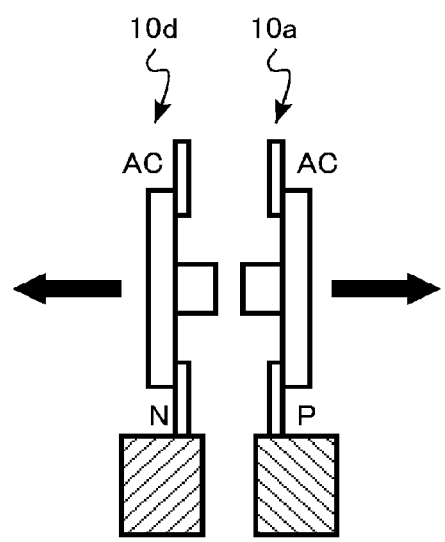
FIG. 12 is a diagram illustrating current directions and magnetic flux directions at the time of operating the semiconductor device according to the third embodiment.

FIG. 12 is a diagram illustrating magnetic flux directions at the time of operating the semiconductor device according to the present embodiment. In the diagram, black arrows indicate the magnetic flux directions.

As illustrated in FIG. 12, the magnetic flux directions are opposite between the first circuit units 10a, 10b, 10c and the second circuit units 10d, 10e, 10f arranged in a manner facing each other. Due to this, magnetic fluxes are cancelled each other between the circuit units facing each other. Therefore, mutual inductance is subtracted from inductance, and the inductance is reduced. As a result, inductance is more reduced than the first embodiment.

According to the present embodiment, provided is the semiconductor module in which inductance is more reduced than the first embodiment, and breakdown of a semiconductor device and noise generation can be suppressed.

Fourth Embodiment

A semiconductor device according to the present embodiment differs from a first embodiment in that circuit units are arranged sharing a capacitor portion. A description for the matters overlapping with the first embodiment will be omitted.

Figure 13:
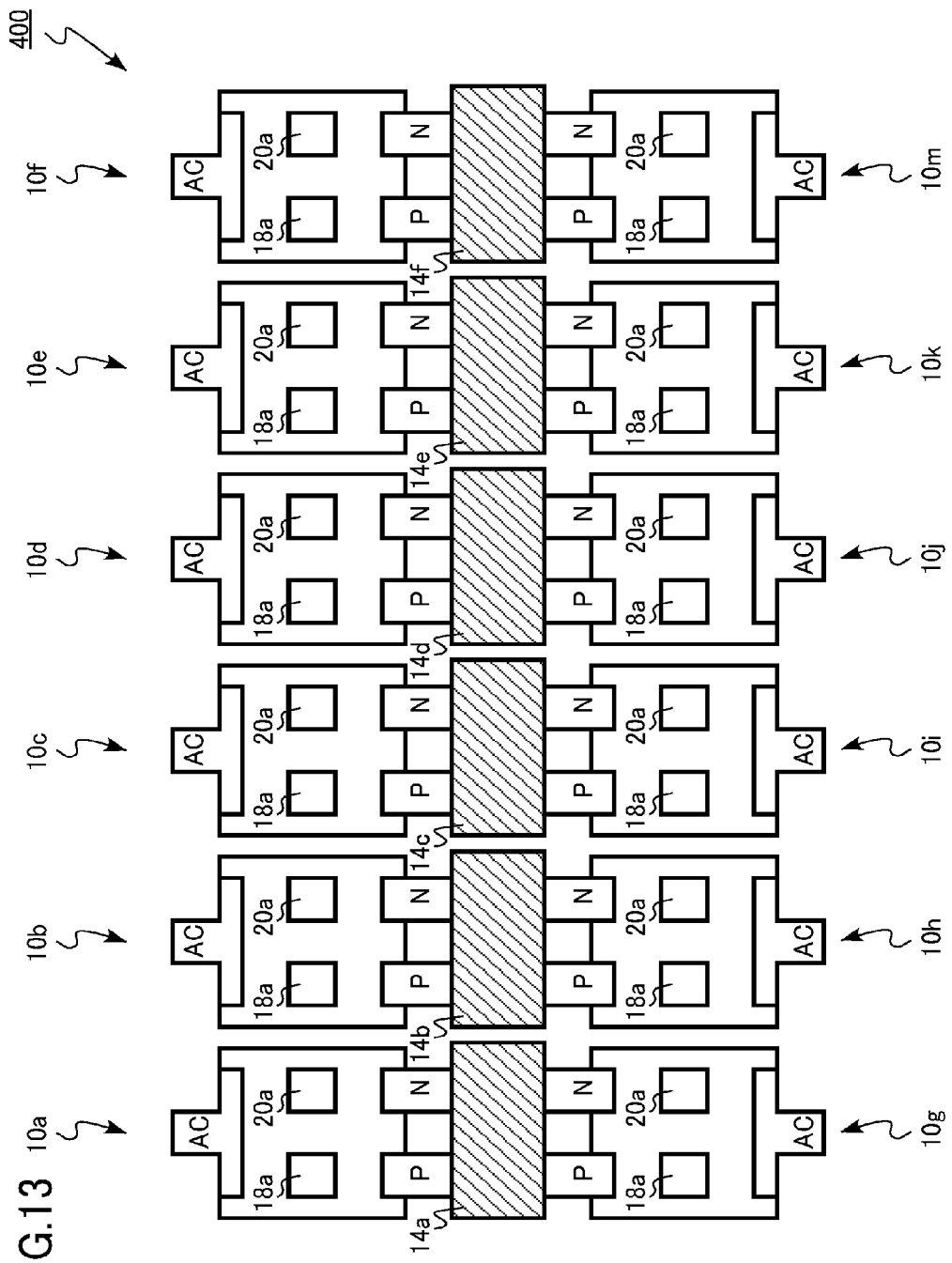
FIG. 13 is a schematic plan view illustrating a semiconductor device according to a fourth embodiment.

FIG. 13 is a schematic plan view illustrating the semiconductor device according to the present embodiment. The semiconductor device according to the present embodiment is a semiconductor module used in an inverter circuit.

A semiconductor module 400 includes a plurality of circuit units 10a to 10m. Each of the circuit units 10a to 10f has a structure similar to the first embodiment. Further, the circuit units 10g to 10m differ from the circuit unit of the first embodiment in sharing capacitor portions 14a to 14f with the circuit units 10a to 10f.

According to the semiconductor module 400 of the present embodiment, the semiconductor module can be down-sized because the capacitor portions are shared even in the case of increasing the number of circuit units in order to obtain a high-current power module, for example.

Fifth Embodiment

An inverter circuit and a driving device according to the present embodiment are driving devices including semiconductor devices according to a first embodiment.

Figure 14:
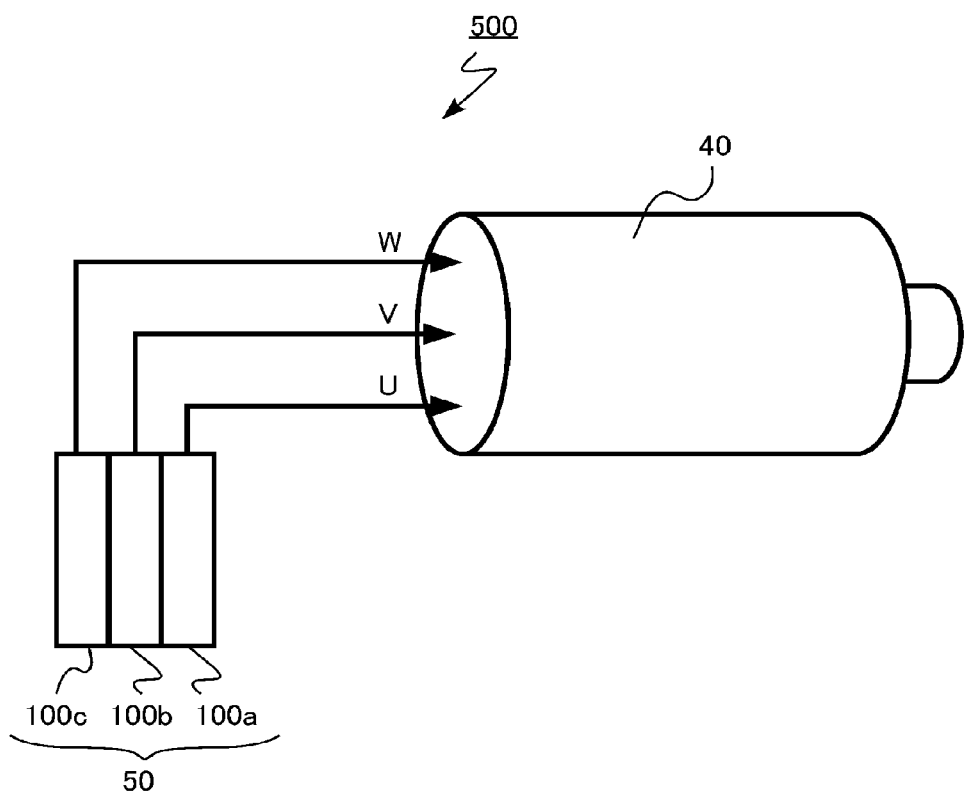
FIG. 14 is a schematic diagram illustrating a driving device according to a fifth embodiment.

FIG. 14 is a schematic diagram illustrating the driving device according to the present embodiment. A driving device 500 includes a motor 40 and an inverter circuit 50.

The inverter circuit 50 is formed of three semiconductor modules 100a, 100b, 100c each having the same structure as the semiconductor module 100 according to the first embodiment. The three semiconductor modules 100a, 100b, 100c are connected in parallel, thereby implementing the three-phase inverter circuit 50 including three AC voltage output terminals U, V, W. The motor 40 is driven by AC voltage output from the inverter circuit 50.

In the inverter circuit 50 and the driving device 500 according to the present embodiment also, breakdown of a semiconductor device and noise generation can be suppressed by reducing inductance of the semiconductor modules 100a, 100b, 100c.

Sixth Embodiment

A vehicle according to the present embodiment is a vehicle including a semiconductor device according to a first embodiment.

Figure 15:
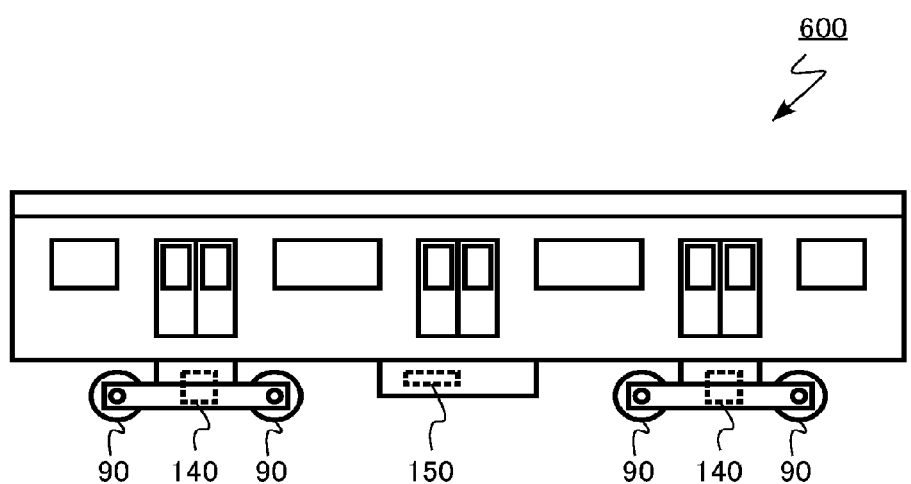
FIG. 15 is a schematic diagram illustrating a vehicle according to a sixth embodiment.

FIG. 15 is a schematic diagram illustrating the vehicle according to the present embodiment. A vehicle 600 according to the present embodiment is a railway vehicle. The vehicle 600 includes a motor 140 and an inverter circuit 150.

The inverter circuit 150 is formed of three semiconductor modules each having the same structure as a semiconductor module 100 according to the first embodiment. The three semiconductor modules are connected in parallel, thereby implementing the three-phase inverter circuit 150 including three AC voltage output terminals U, V, W.

The motor 140 is driven by AC voltage output from the inverter circuit 150. A wheel 90 of the vehicle 600 is rotated by the motor 140.

The vehicle 600 according to the present embodiment provides high reliability by including the inverter circuit 150 in which breakdown of a semiconductor device and noise generation are suppressed Seventh Embodiment A vehicle according to the present embodiment is a vehicle including a semiconductor device according to a first embodiment.

Figure 16:
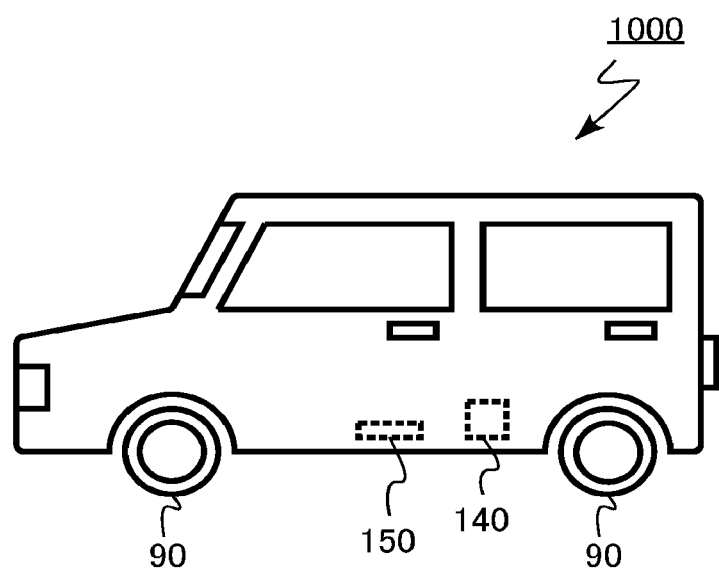
FIG. 16 is a schematic diagram illustrating a vehicle according to a seventh embodiment.

FIG. 16 is a schematic diagram illustrating the vehicle according to the present embodiment. A vehicle 1000 according to the present embodiment is an automobile. The vehicle 1000 includes a motor 140 and an inverter circuit 150.

The inverter circuit 150 is formed of three semiconductor modules each having the same structure as a semiconductor module 100 according to the first embodiment. The three semiconductor modules are connected in parallel, thereby implementing the three-phase inverter circuit 150 including three AC voltage output terminals U, V, W.

The motor 140 is driven by AC voltage output from the inverter circuit 150. A wheel 90 of the vehicle 1000 is rotated by the motor 140.

The vehicle 1000 according to the present embodiment provides high reliability by including the inverter circuit 150 in which breakdown of a semiconductor device and noise generation are suppressed Eighth Embodiment An elevator according to the present embodiment is an elevator including a semiconductor device according to a first embodiment.

Figure 17:
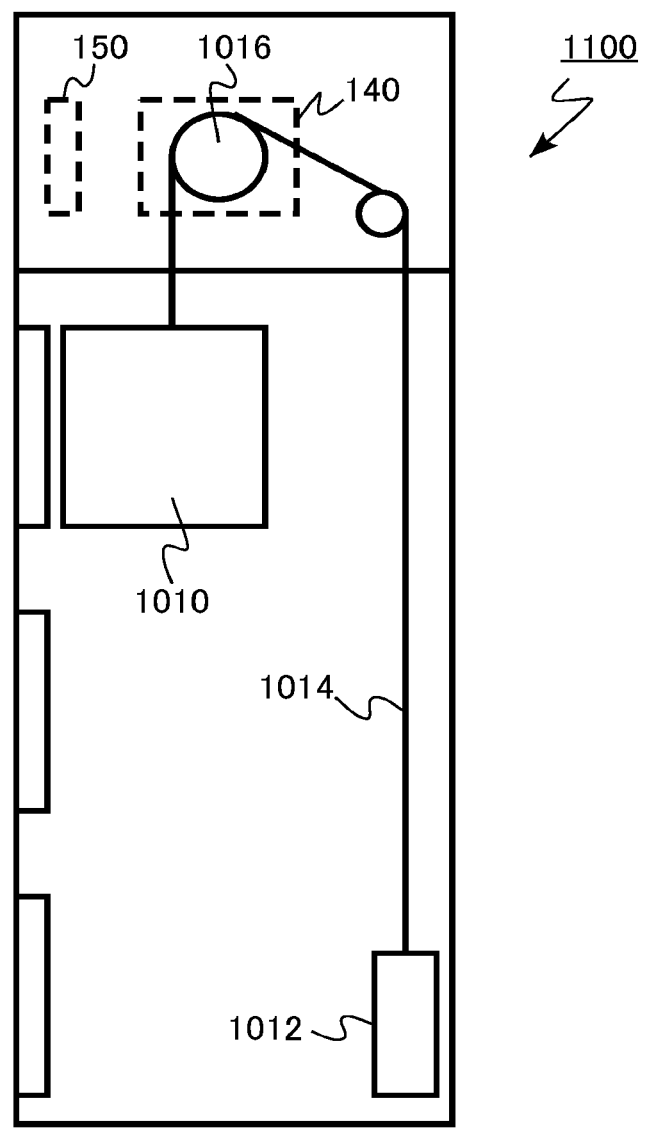
FIG. 17 is a schematic diagram illustrating an elevator according to an eighth embodiment.

FIG. 17 is a schematic diagram illustrating the elevator according to the present embodiment. An elevator 1100 according to the present embodiment includes a basket 1010, a counterweight 1012, a wire rope 1014, a winding machine 1016, a motor 140, and an inverter circuit 150.

The inverter circuit 150 is formed of three semiconductor modules each having the same structure as a semiconductor module 100 according to the first embodiment. The three semiconductor modules are connected in parallel, thereby implementing the three-phase inverter circuit 150 including three AC voltage output terminals U, V, W.

The motor 140 is driven by AC voltage output from the inverter circuit 150. The winding machine 1016 is rotated by the motor 140, and the basket 1010 is moved up and down.

The elevator 1100 according to the present embodiment provides high reliability by including the inverter circuit 150 in which breakdown of a semiconductor device and noise generation are suppressed.

Ninth Embodiment

A semiconductor device according to the present embodiment includes a substrate, a first electrode on a first side of the substrate, a second electrode aligned with the first electrode on the first side of the substrate, a third electrode on a second side of the substrate, and a first switching element and a second switching element. The first switching element and the second switching element are aligned on the substrate between the first electrode, the second electrode, and the third electrode, electrically connected in series between the first electrode and the second electrode, and have the third electrode electrically connected therebetween.

Figure 18:
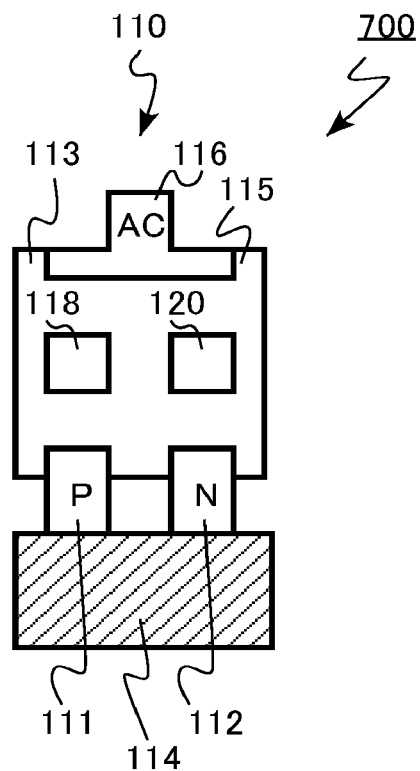
FIG. 18 is a schematic plan view illustrating a semiconductor device according to a ninth embodiment.

FIG. 18 is a schematic plan view illustrating the semiconductor device according to the present embodiment. The semiconductor device according to the present embodiment is a semiconductor module used in an inverter circuit.

A semiconductor module 700 includes a first electrode 111, a second electrode 112, a switching element portion 113, a capacitor portion 114, and an AC electrode (third electrode) 116. Further, the semiconductor module 700 includes a gate signal terminal not illustrated.

The switching element portion 113 includes an insulating or conductive substrate 115. The first electrode 111 and the second electrode 112 are provided in a manner aligned with each other at a first end portion (first side) of the substrate 115. The AC electrode 116 is provided at a second end portion (second side) opposite to the first end portion of the substrate 115.

The switching element portion 113 includes a first switching element 118 and a second switching element 120. The first switching element 118 and the second switching element 120 are provided in a manner aligned with each other on the substrate 115 between the first electrode 111, the second electrode 112, and the AC electrode 116.

The capacitor portion 114 is provided interposing the first electrode 111 and the second electrode 112 on the way to the switching element portion 113.

In the semiconductor module 700, a direction of current flowing between the first electrode 111 and the AC electrode 116 is opposite to a direction of current flowing between the AC electrode 116 and the second electrode 112.

Therefore, inductance is reduced, compared to a case where the first electrode, first switching element, AC electrode, second switching element, and second electrode are arranged linearly on the substrate, for example. As a result, provided is the semiconductor module in which breakdown of a semiconductor device and noise generation can be suppressed.

As described above, in the first to sixth embodiments, the example in which the first switching element and the second switching element are the MOSFETs has been described, but an insulated gate bipolar transistor (IGBT), a high electron mobility transistor (HEMT), and the like may also be applicable.

Further, in the first to sixth embodiments, the example of applying silicon carbide (SiC) as semiconductor material of the first switching element and the second switching element has been described, but silicon (Si), gallium nitride (GaN), and the like may also be applicable.

Furthermore, in the first to sixth embodiments, the exemplary case where the respective circuit units have independent capacitor portions has been described, but it is also possible to have a structure in which all of circuit units share one capacitor portion.

Additionally, each of the circuit units can have a structure in which a heat sink is provided on a surface of the substrate opposing to a surface where the switching element of the switching element portion is provided.

Further, in the sixth to eighth embodiments, the exemplary cases of applying the semiconductor device according to the present disclosure to the vehicle and the elevator have been described, but the semiconductor device according to the present disclosure is also applicable to, for example, a power conditioner of a solar power system and the like.

While certain embodiments have been described, these embodiments have been presented by way of example only, and are not intended to limit the scope of the inventions. Indeed, the inverter circuit, the driving device, the vehicle, and the elevator described herein may be embodied in a variety of other forms, furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising a plurality of circuit units, each of the circuit units including:
    a substrate;
    a first electrode provided on a first side of the substrate;
    a second electrode aligned with the first electrode on the first side of the substrate;
    a third electrode provided on a second side of the substrate; and
    a first switching element and a second switching element neighboring the first switching element, the first switching element and the second switching element being aligned on the substrate between the first electrode, the second electrode, and the third electrode, the first switching element and the second switching element being electrically connected in series between the first electrode and the second electrode, and the third electrode being electrically connected between the first switching element and the second switching element.

2. The semiconductor device according to claim 1, wherein, in two adjacent circuit units of the plurality of circuit units, the first side of one circuit unit of the two adjacent circuit units and the first side of the other circuit unit are adjacent to each other and the second side of the one circuit unit and the second side of the other circuit unit are adjacent to each other.

3. The semiconductor device according to claim 1, wherein the first electrode of each of the circuit units are mutually connected and the second electrode of each of the circuit units are mutually connected.

4. The semiconductor device according to claim 1, wherein each of the circuit units includes a capacitor, the capacitor is electrically connected between the first electrode and the second electrode, the first electrode is electrically in between the capacitor and the first switching element, and the second electrode is electrically in between the capacitor and the second switching element.

5. The semiconductor device according to claim 1, wherein, in two adjacent circuit units of the plurality of circuit units, the first electrode of one circuit unit and the second electrode of the other circuit unit are adjacent to each other.

6. The semiconductor device according to claim 1, wherein, in two adjacent circuit units of the plurality of circuit units, the first electrode of one circuit unit of the two adjacent circuit units and the first electrode of the other circuit unit are adjacent to each other, or the second electrode of the one circuit unit and the second electrode of the other circuit unit are adjacent to each other.

7. The semiconductor device according to claim 1, wherein a direction of current flowing between the first electrode and the third electrode is opposite to a direction of current flowing between the third electrode and the second electrode.

8. The semiconductor device according to claim 1, wherein the second side is located on an opposite side of the first side, interposing the substrate.

9. A semiconductor device comprising:
  a plurality of first circuit units arranged side by side, each of the first circuit units including:
    a first substrate;
    a first electrode provided on a first side of the first substrate;
    a second electrode aligned with the first electrode on the first side of the first substrate;
    a third electrode provided on a second side of the first substrate; and
    a first switching element and a second switching element neighboring the first switching element, the first switching element and the second switching element being aligned with each other on the first substrate between the first electrode, the second electrode, and the third electrode, the first switching element and the second switching element being electrically connected in series between the first electrode and the second electrode, and the third electrode being electrically connected between the first switching element and the second switching element; and
  a plurality of second circuit units arranged side by side, each of the second circuit units including:
    a second substrate;
    a first electrode provided on a first side of the second substrate;
    a second electrode aligned with the first electrode on the first side of the second substrate;
    a third electrode provided on a second side of the second substrate; and
    a first switching element and a second switching element, the first switching element and the second switching element being aligned on the second substrate between the first electrode, the second electrode, and the third electrode, the first switching element and the second switching element being electrically connected in series between the first electrode and the second electrode, and the third electrode being electrically connected between the first switching element and the second switching element;
  wherein
    in each of the first circuit units and the second circuit units, the first substrate and the second substrate face each other, the first electrode of one of the first and second circuit units and the second electrode of the other one of the first and second circuit units face each other,
    in two adjacent circuit units of the plurality of the first circuit units, the first side of one circuit unit of the adjacent circuit units and the first side of the other circuit unit are adjacent to each other and the second side of the one circuit unit and the second side of the other circuit unit are adjacent to each other, and
    in two adjacent circuit units of the plurality of the second circuit units, the first side of one circuit unit of the adjacent circuit units and the first side of the other circuit unit are adjacent to each other and the second side of the one circuit unit and the second side of the other circuit unit are adjacent to each other.

10. The semiconductor device according to claim 9, wherein the first electrode of each of the first circuit units and the second circuit units are mutually connected and the second electrode of each of the first circuit units and the second circuit units are mutually connected.

11. The semiconductor device according to claim 9, wherein each of the first circuit units and the second circuit units includes a capacitor, the capacitor is electrically connected between the first electrode and the second electrode, the first electrode is electrically in between the capacitor and the first switching element, and the second electrode is electrically in between the capacitor and the second switching element.

12. The semiconductor device according to claim 9, wherein a direction of current flowing between the first electrode and the third electrode is opposite to a direction of current flowing between the third electrode and the second electrode.

13. A semiconductor device comprising a first circuit unit and a second circuit unit, each of the first circuit unit and the second circuit unit including:
  a substrate;
  a first electrode provided on a first side of the substrate;
  a second electrode aligned with the first electrode on the first side of the substrate;
  a third electrode provided on a second side of the substrate; and
  a first switching element and a second switching element neighboring the first switching element, the first switching element and the second switching element being aligned on the substrate between the first electrode, the second electrode, and the third electrode, the first switching element and the second switching element being electrically connected in series between the first electrode and the second electrode, and the third electrode being electrically connected between the first switching element and the second switching element,
  wherein the first side of the first circuit unit and the first side of the second circuit unit are adjacent to each other, and the second side of the first circuit unit and the second side of the second circuit unit are adjacent to each other.

14. The semiconductor device according to claim 1, wherein the first switching element and the second switching element are MOSFETs or IGBTs.

15. An inverter circuit including a semiconductor device according to claim 1.

16. A driving device including a semiconductor device according to claim 1.

17. A vehicle including a semiconductor device according to claim 1.

18. An elevator including a semiconductor device according to claim 1.

* * * * *